(12) United States Patent
Lee et al.

(10) Patent No.: US 9,307,659 B2
(45) Date of Patent: Apr. 5, 2016

(54) CONSTRAINT MECHANISM AND RELATED ELECTRONIC DEVICE

(71) Applicant: Wistron Corporation, New Taipei (TW)

(72) Inventors: Dian-Hua Lee, New Taipei (TW); Yi-Jiun Lin, New Taipei (TW); Chuan-Yi Liang, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 0 days.

(21) Appl. No.: 13/913,525

(22) Filed: Jun. 10, 2013

(65) Prior Publication Data

US 2014/0062273 A1 Mar. 6, 2014

(30) Foreign Application Priority Data

Aug. 28, 2012 (TW) .............................. 101131200 A

(51) Int. Cl.
*H05K 5/02* (2006.01)
*H05K 7/14* (2006.01)
*G06F 1/18* (2006.01)

(52) U.S. Cl.
CPC ............ *H05K 5/0221* (2013.01); *H05K 7/1489* (2013.01); *G06F 1/181* (2013.01); *Y10T 403/1624* (2015.01)

(58) Field of Classification Search
CPC ..... G06F 1/181; G06F 1/1633; E05B 65/006; E05B 65/52; E05C 1/04
USPC ............ 312/223.2, 265.5, 265.6; 292/80, 81, 292/87, 1, DIG. 11, DIG. 53, DIG. 54, 137, 292/138; 220/326, 324, 315, 4.02, 3.94, 220/3.9, 3.7
See application file for complete search history.

(56) References Cited

U.S. PATENT DOCUMENTS 3,694,015 A * 9/1972 Gley ................................ 292/80
4,505,526 A * 3/1985 Leck .............................. 312/333
(Continued)

FOREIGN PATENT DOCUMENTS

| TW | M323738 | 12/2007 |
| TW | I293239 | 2/2008 |
| TW | M421403 | 1/2012 |

OTHER PUBLICATIONS

Office action mailed on Aug. 13, 2014 for the Taiwan application No. 101131200, filing date: Aug. 28, 2012, p. 1 line 12~14, p. 2 and p. 3 line 1~13 Translation.
(Continued)

*Primary Examiner* — Daniel J Troy
*Assistant Examiner* — Andrew Roersma
(74) *Attorney, Agent, or Firm* — Winston Hsu; Scott Margo

(57) ABSTRACT

A constraint mechanism includes a constraint component disposed on a second housing, and a flexible component disposed on a first housing. The constraint component includes a guide slot and an engaging portion. The flexible component includes a main body, a bending portion and a contacting portion. A first edge of the main body is fixed by a side of an opening on the first housing. A first side of the bending portion is connected to the main body, and is located at a position adjacent to a second edge of the main body. The contacting portion is disposed on a second side of the bending portion. A rim of the contacting portion is an arc structure. The contacting portion moves along the guide slot, so that the arc structure can be constrained by the engaging portion, to constrain a movement of the first housing relative to the second housing.

15 Claims, 12 Drawing Sheets

(56) References Cited

U.S. PATENT DOCUMENTS

| | | | |
|---|---|---|---|
| 5,136,466 A * | 8/1992 | Remise et al. | 361/679.37 |
| 6,627,812 B2 * | 9/2003 | Kim et al. | 174/387 |
| 6,920,048 B2 * | 7/2005 | Holt et al. | 361/726 |
| 6,935,661 B1 * | 8/2005 | Farnsworth et al. | 292/162 |
| 7,540,575 B2 * | 6/2009 | Mau | 312/223.2 |
| 7,581,303 B2 * | 9/2009 | Soule et al. | 29/592 |
| 7,663,873 B2 * | 2/2010 | Lau | 361/679.39 |
| 8,134,844 B2 | 3/2012 | Park | |
| 2009/0102334 A1 | 4/2009 | Chen | |
| 2010/0189492 A1 * | 7/2010 | Green | 403/71 |

OTHER PUBLICATIONS

Office action mailed on Dec. 2, 2015 for the China application No. 201210334924.6, p. 3 line 5-34, p. 4-6 and p. 7 line 1-18.

* cited by examiner

CONSTRAINT MECHANISM AND RELATED ELECTRONIC DEVICE

BACKGROUND OF THE INVENTION

1. Field of the Invention

The present invention relates to a constraint mechanism and a related electronic device, and more particularly, to a constraint mechanism having effective constraining function and a related electronic device.

2. Description of the Prior Art

A conventional server system includes a plurality of hosts and a frame, each host can be detachably disposed on the frame, and a maintenance worker can rapidly replace the host for repair. Each host includes two housings. One of the housings holds the electronic components, and the other housing covers above the electronic components for protection. Generally, the housings are fixed by screws or engagement. The housings fixed by the screws are stable, and a screwdriver is necessary for separation of the housings fixed by the screws. The housings fixed by the engagement have an advantage of rapid assembly without tools. However, the fixing effect of the housings fixed by the engagement is unstable. The conventional engagement breaks down easily due to the weight of the housing. Therefore, design of a constraint mechanism capable of executing the lock and unlock function without tools and having an available engagement is an important issue in the mechanical industry.

SUMMARY OF THE INVENTION

The present invention provides a constraint mechanism having effective constraining function and a related electronic device for solving above drawbacks.

According to the claimed invention, a constraint mechanism of constraining a movement of a first housing relative to a second housing is disclosed. The constraint mechanism includes a constraint component and a flexible component. The constraint component is disposed on the second housing. The constraint component includes a guide slot and an engaging portion. The engaging portion is disposed on an inner lateral surface of the guide slot. The flexible component is disposed on the first housing. The flexible component includes a main body, a bending portion and a contacting portion. The main body covers an opening on the first housing. A first edge of the main body is fixed on the first housing. A first side of the bending portion is connected to the main body. A distance between the bending portion and the first edge of the main body is greater than a distance between the bending portion and a second edge of the main body opposite to the first edge. The contacting portion is disposed on a second side of the bending portion. The contacting portion is blocked by the engaging portion to constrain the movement of the first housing relative to the second housing when the contacting portion moves along the guide slot to a predetermined position.

According to the claimed invention, deformation of the flexible component is greater than a thickness of the engaging portion.

According to the claimed invention, a boundary of the contacting portion is an arc structure.

According to the claimed invention, the arc structure is a semicircular structure or a dual hemming structure.

According to the claimed invention, a sunken structure is formed on a surface of the engaging portion, and the arc structure is accommodated inside the sunken structure when the arc structure contacts against the engaging portion.

According to the claimed invention, the main body of the flexible component is a curved structure. A distance between the second edge and the first housing is smaller than a distance between the first housing and a central area of the main body.

According to the claimed invention, the constraint mechanism further includes a baffle disposed on the first housing. The baffle covers the flexible component, and an interval is formed between the baffle and the flexible component.

According to the claimed invention, the interval is smaller than a maximum deformation of the main body of the flexible component.

According to the claimed invention, the first side of the bending portion is connected to the second edge of the main body.

According to the claimed invention, an electronic device includes a second housing, a first housing and a constraint mechanism. At least one electronic component is disposed inside the second housing. The first housing is movably disposed on the second housing. An opening is formed on a surface of the first housing. The constraint mechanism can constrain a movement of the first housing relative to the second housing. The constraint mechanism includes a constraint component and a flexible component. The constraint component is disposed on the second housing. The constraint component includes a guide slot and an engaging portion. The engaging portion is disposed on an inner lateral surface of the guide slot. The flexible component is disposed on the first housing. The flexible component includes a main body, a bending portion and a contacting portion. The main body covers an opening on the first housing. A first edge of the main body is fixed on the first housing. A first side of the bending portion is connected to the main body. A distance between the bending portion and the first edge of the main body is greater than a distance between the bending portion and a second edge of the main body opposite to the first edge. The contacting portion is disposed on a second side of the bending portion. The contacting portion is blocked by the engaging portion to constrain the movement of the first housing relative to the second housing when the contacting portion moves along the guide slot to a predetermined position.

According to the claimed invention, the electronic device further includes a press component movably disposed on the first housing. The press component covers the opening and is placed above the flexible component.

The present invention can lock and unlock the constraint mechanism without tools. The constraint mechanism of the present invention forms the arc structure on the boundary of the contacting portion. The arc structure can be the metal unit including folded edges, and the folded edges are hemmed to 180 degrees. When the contacting portion presses the engaging portion excessively, the contacting portion is deformed, and the deformed contacting portion can slide toward the inner of the engaging portion by the arc structure, so as to prevent the contacting portion from departing from the constraint range of the engaging portion, and to increase the constraint effect of the constraint mechanism. The constraint mechanism of the present invention has advantages of easy structure, simple operation and low manufacturing cost. The present invention can effectively keep the constraint function, so that the constraint mechanism can be widespread applied to the server, the desktop host and so on.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
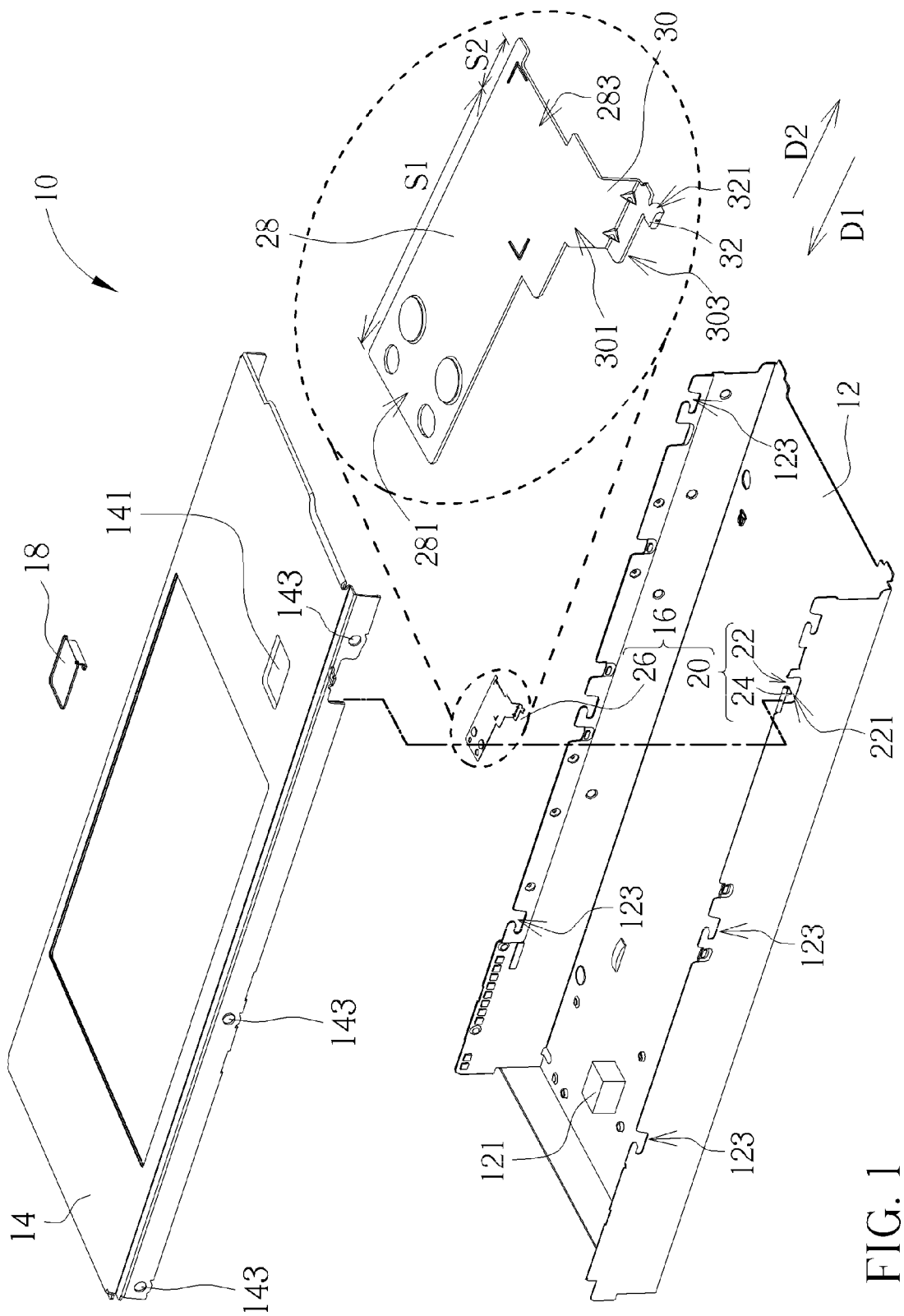
FIG. 1 is an exploded diagram of an electronic device according to an embodiment of the present invention.
Figure 2:
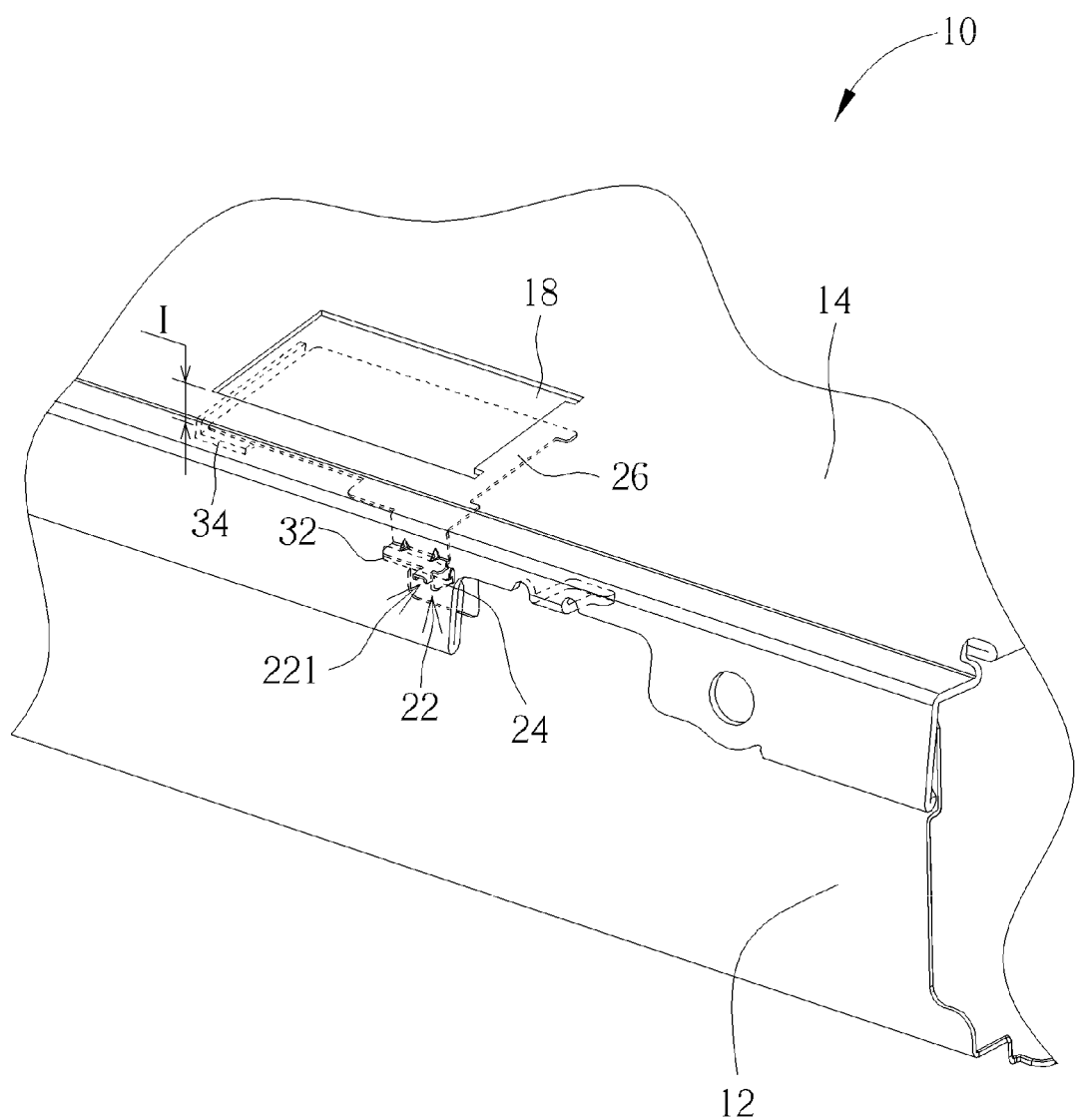
FIG. 2 is an assembly diagram of the electronic device according to the embodiment of the present invention.

Please refer to FIG. 1 and FIG. 2. FIG. 1 is an exploded diagram of an electronic device 10 according to an embodiment of the present invention. FIG. 2 is an assembly diagram of the electronic device 10 according to the embodiment of the present invention. The electronic device 10 includes a second housing 12, a first housing 14, a constraint mechanism 16 and a press component 18. The electronic device 10 can be a server or a host. The second housing 12 can be a base of the electronic device 10. The second housing 12 is for holding a plurality of electronic components 121, such as a memory module, a processor, a circuit board and so on. The first housing 14 can be movably disposed on the second housing 12 for closing the case of the electronic device 10, so as to protect the electronic components 121. An opening 141 is formed on a surface of the first housing 14. The constraint mechanism 16 is disposed on the second housing 12 and the first housing 14, to constrain a relative movement between the second housing 12 and the first housing 14. The press component 18 is movably disposed on the first housing 14. The press component 18 can cover the opening 141 and is placed above the constraint mechanism 16. The press component 18 can be pressed by user's finger, and the press component 18 can pass through the opening 14 to execute lock and unlock functions of the constraint mechanism 16.

The constraint mechanism 16 includes a constraint component 20 disposed on the second housing 12. As shown in FIG. 1, the constraint component 20 can be integrated with the second housing 12 monolithically. The constraint component 20 includes a guide slot 22 and an engaging portion 24. The engaging portion 24 is disposed on an inner lateral surface 221 of the guide slot 22. The constraint mechanism 16 further includes a flexible component 26 detachably disposed on the first housing 14. The flexible component 26 includes a main body 28, a bending portion 30 and a contacting portion 32. The main body 28 includes a first edge 281 and a second edge 283. The first edge 281 is fixed on the first housing 14, such as fixed by a rivet, and is placed by the opening 141. Thus, the main body 28 can cover the opening 141, the press component 18 can be pressed by the user's finger to pass through the opening 141 and to deform the main body 28. The second edge 283 is connected to the bending portion 30. The first edge 281 of the main body 28 is a fixed edge, and the second edge 283 is a free edge.

The bending portion 30 can be an L-shaped structure. A first side 301 of the bending portion 30 is connected to the second edge 283 of the main body 28, and a second side 303 of the bending portion 30 is connected to the contacting portion 32. The bending portion 30 is adjacent to the free edge of the main body 28, which means a distance S1 between the bending portion 30 and the first edge 281 is greater than a distance S2 between the bending portion 30 and the second edge 283. As the flexible component 26 moves to a predetermined position and is deformed by an external force, the bending portion 30 can bend the contacting portion 32 downwardly, so as to adjust the relative position between the contacting portion 32 and the engaging portion 24. The predetermined position can be a position where the contacting portion 32 just contacts the engaging portion 24. A boundary of the contacting portion 32 can be an arc structure 321.

Generally, the contacting portion 32 can be a punching metal unit, edges of the metal unit are hemmed to 180 degrees, and the arc structure 321 can be manufactured as a semicircular structure, such as a dual hemming structure. The arc structure 321 of the contacting portion 32 can further be a cam, a curvature of the cam is designed according to actual demand, and detailed description is omitted herein for simplicity. The contacting portion 32 slides along the guide slot 22 when the first housing 14 moves relative to the second housing 12. As the contacting portion 32 moves to the end of the guide slot 22, as the end can be the inner lateral surface 221, the contact portion 32 is blocked by the engaging portion 24 to constrain the movement of the first housing 14 relative to the second housing 12.

In addition, the constraint mechanism 16 can further include a baffle 34 disposed inside the first housing 14. The baffle 34 can cover the flexible component 26, and an interval I is formed between the baffle 34 and the flexible component 26. Dimension of the interval I can not be greater than a maximum deformation of the main body 28 of the flexible component 26. It is to say, the baffle 34 can constrain the deformation of the main body 28 when the flexible component 26 is resiliently deformed, so as to prevent the flexible component 26 from resilient fatigue because of over-bending.

As shown in FIG. 1 and FIG. 2, the second housing 12 can include a plurality of block slots 123, and the first housing 14 can includes a plurality of block pillar 143. Position of each block pillar 143 corresponds to the corresponding block slot 123. For assembly of the second housing 12 and the first housing 14, the first housing 14 aligns with the second housing 12, and the first housing 14 moves relative to the second housing 12 at a first direction D1. Meanwhile, each block pillar 143 is inserted into the corresponding block slot 123, and slides to the end of the block slot 123 with the relative movement between the second housing 12 and the first housing 14. Then, the contacting portion 32 of the flexible component 26 can move along the guide slot 22 and be blocked by the engaging portion 24 when each block pillar 143 stops at the end of the corresponding block slot 123.

It should be mentioned that the contacting portion 32 is spaced from an inner wall of the engaging portion 24 when the contacting portion 32 is placed inside the guide slot 22, which means that the contacting portion 32 may be free and is not blocked by the engaging portion 24 when the contacting portion 32 enters a constraint range of the engaging portion 24. As the constraint mechanism 16 is not released, the contacting portion 32 moves a tiny distance to tightly contact against the engaging portion 24 when the first housing 14 moves relative to the second housing 12 at a second direction D2 opposite to the first direction D1. Thus, the constraint component 20 can constrain the movement of the flexible component 26, and further simultaneously constrain the movement of the first housing 14 relative to the second housing 12.

Figure 3:
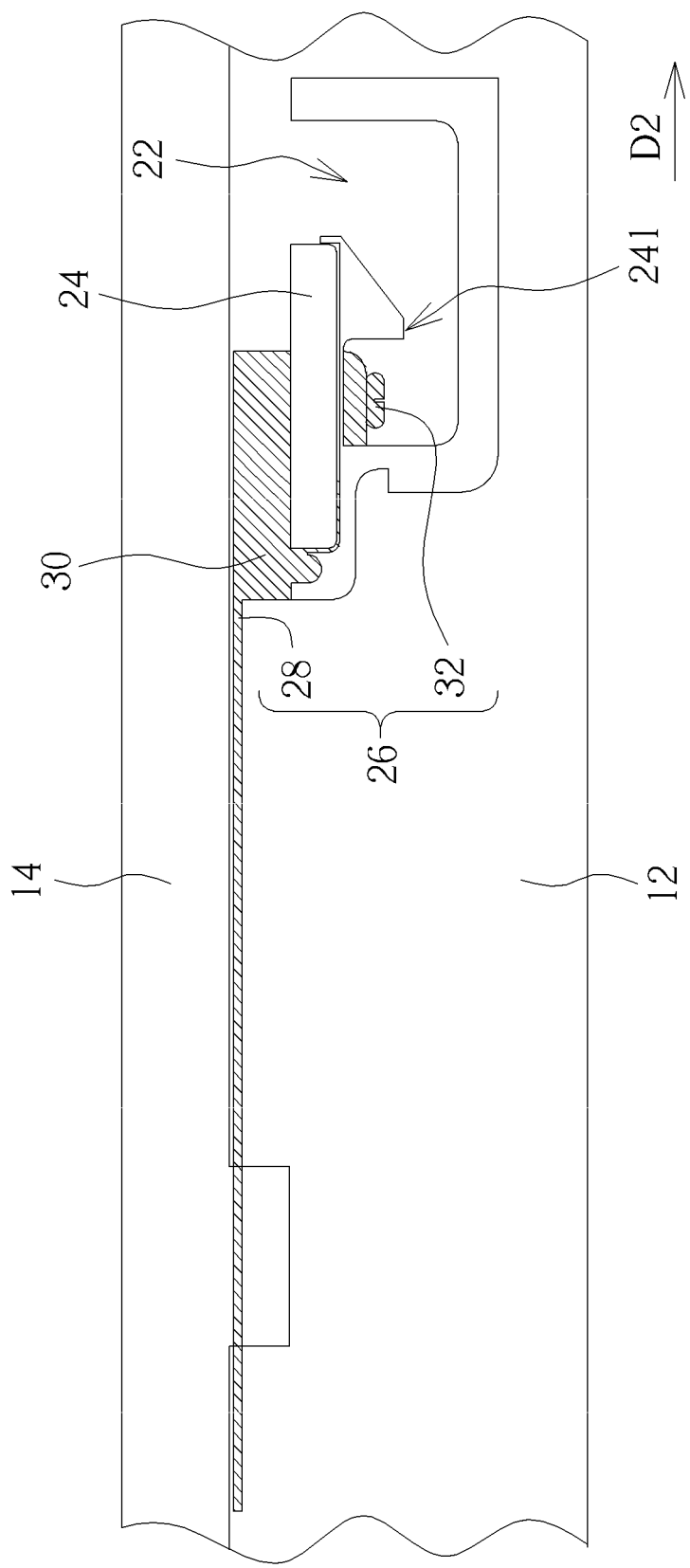
FIG. 3 and FIG. 4 respectively are sectional views of a constraint mechanism in different operational modes according to the embodiment of the present invention.
Figure 4:
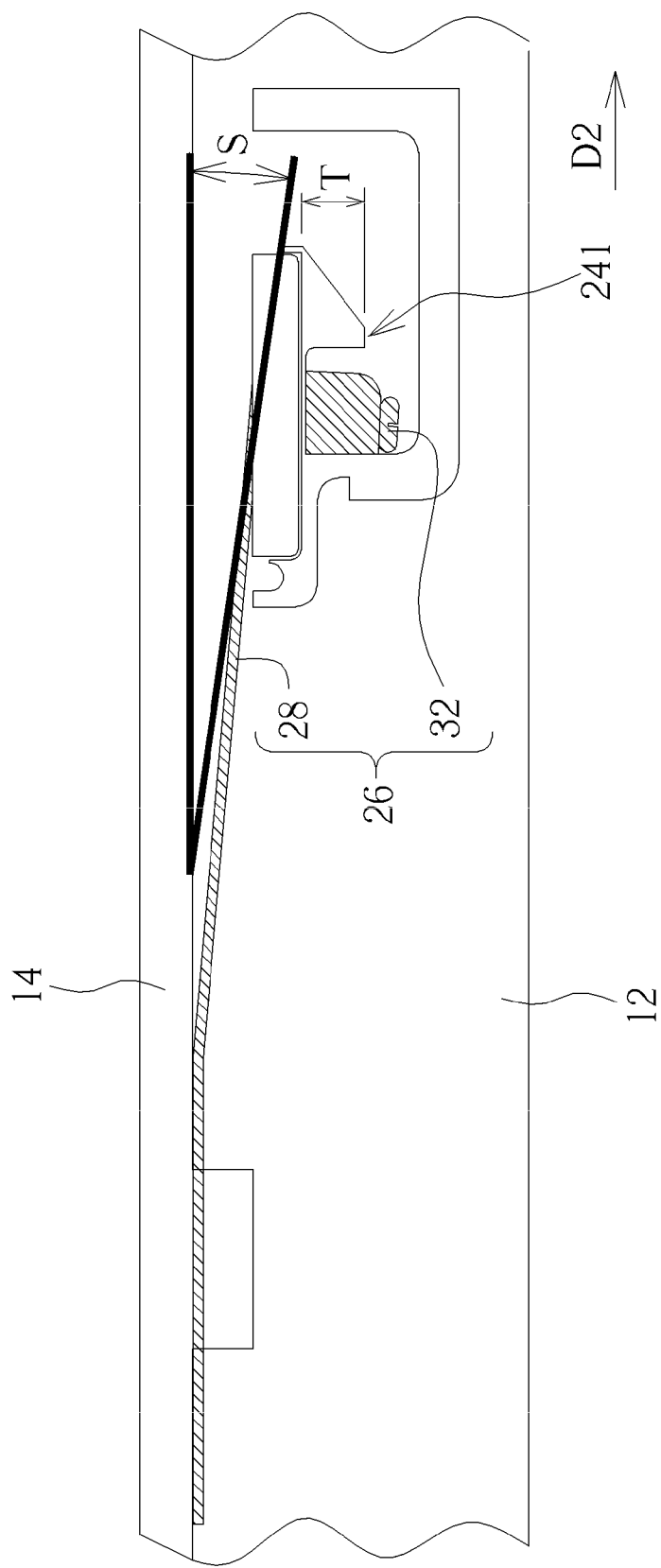

Please refer to FIG. 2 to FIG. 4. FIG. 3 and FIG. 4 respectively are sectional views of the constraint mechanism 16 in different operational modes according to the embodiment of the present invention. As shown in FIG. 3, the contacting portion 32 of the flexible component 26 is engaged with the engaging portion 24 of the constraint component 20. A bottom (the lowest position) of the contacting portion 32 is substantially higher than a top 241 (the lowest position) of the engaging portion 24, so that the first housing 14 is not separated from the second housing 12. For releasing the constraint mechanism 16, as shown in FIG. 4, the main body 28 of the flexible component 26 is bent downwardly, deformation S of the flexible component 26 can be substantially greater than a thickness T of the engaging portion 24. The thickness T equals dimension of the top 241. The bottom of the contacting portion 32 is lower than the top 241 of the engaging portion 24, the contacting portion 32 is not blocked by the engaging portion 24, and the first housing 14 can move relative to the second housing 12 at the second direction D2 for separation.

Figure 5:
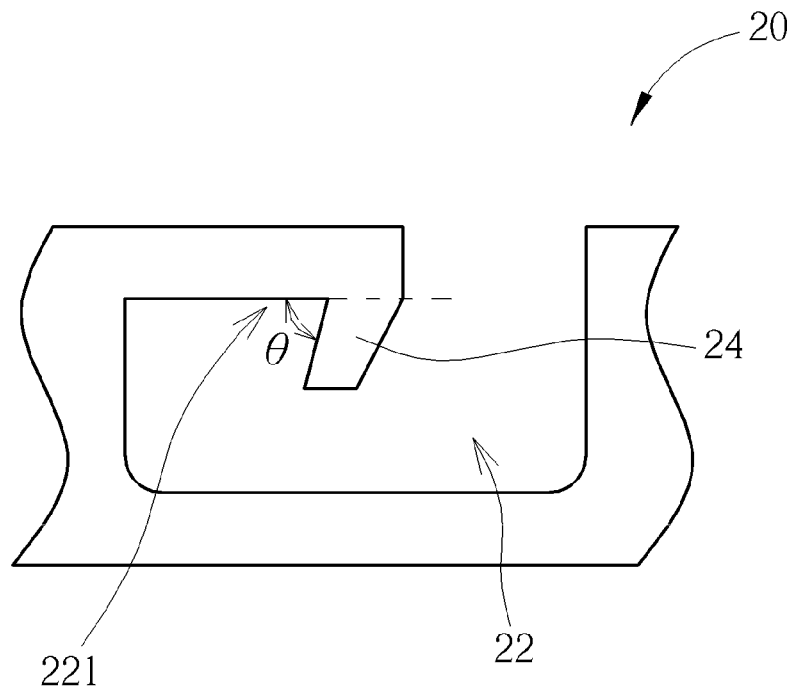
FIG. 5 to FIG. 9 respectively are lateral views of an engaging portion according to different embodiments of the present invention.
Figure 6:
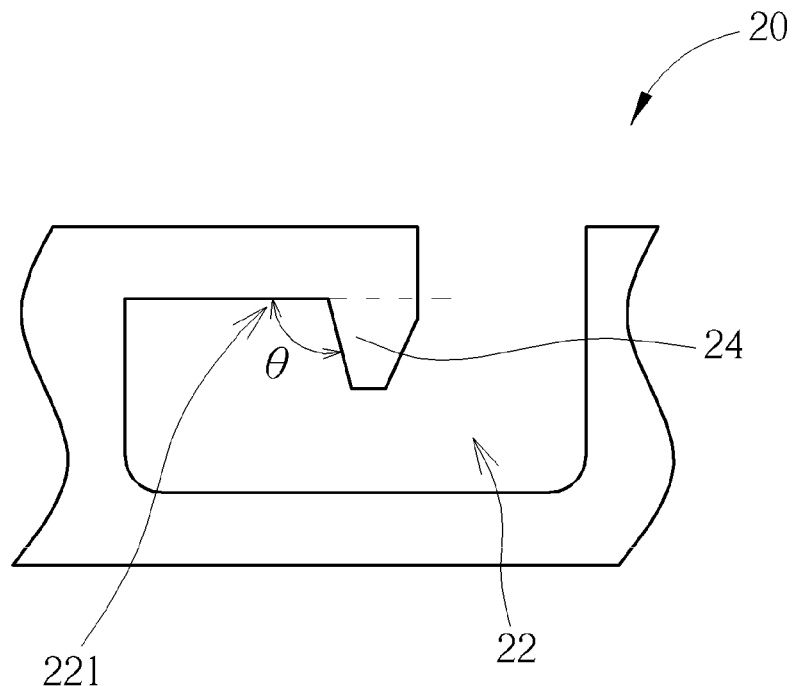
Figure 7:
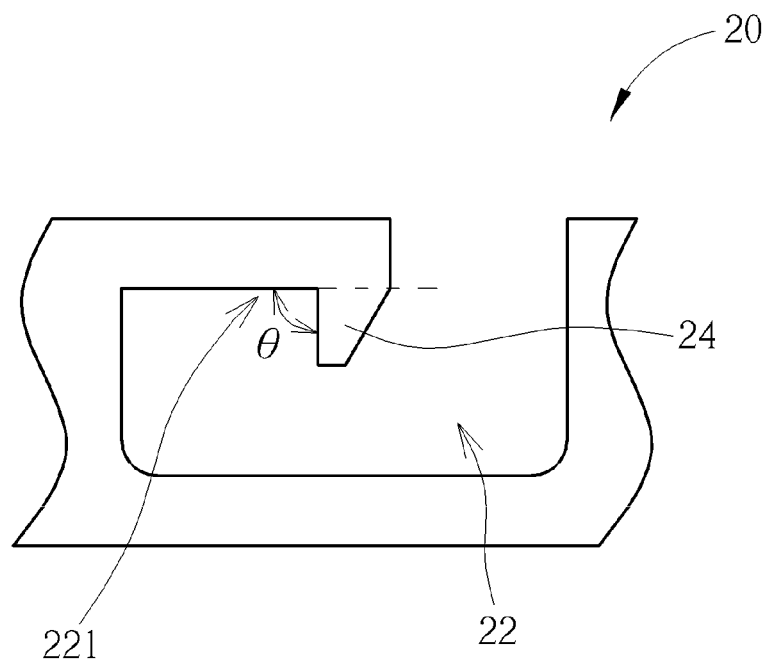

Please refer to FIG. 5 to FIG. 9. FIG. 5 to FIG. 9 respectively are lateral views of the engaging portion 24 according to different embodiments of the present invention. As shown in FIG. 5 to FIG. 7, an angle θ between the engaging portion 24 and the inner lateral surface 221 of the guide slot 22 can be any degrees. A dotted line shown in FIG. 5 to FIG. 9 can be a boundary line between the engaging portion 24 and the inner lateral surface 221. Because the boundary of the contacting portion 32 can be the arc structure 321, the arc structure 321 can move the contacting portion 32 relative to the engaging portion 24 upwardly when the contacting portion 32 moves at the second direction D2 to push the engaging portion 24. The contacting portion 32 can be placed inside the constraint range of the engaging portion 24 even if the bending portion 30 is bent and deformed, so as to keep the constraint function of the constraint mechanism 16.

Figure 8:
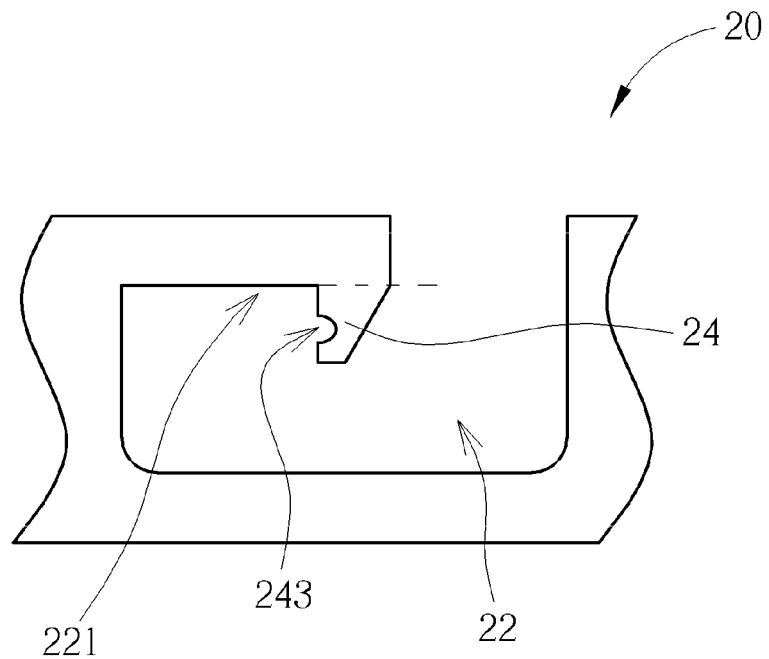
Figure 9:
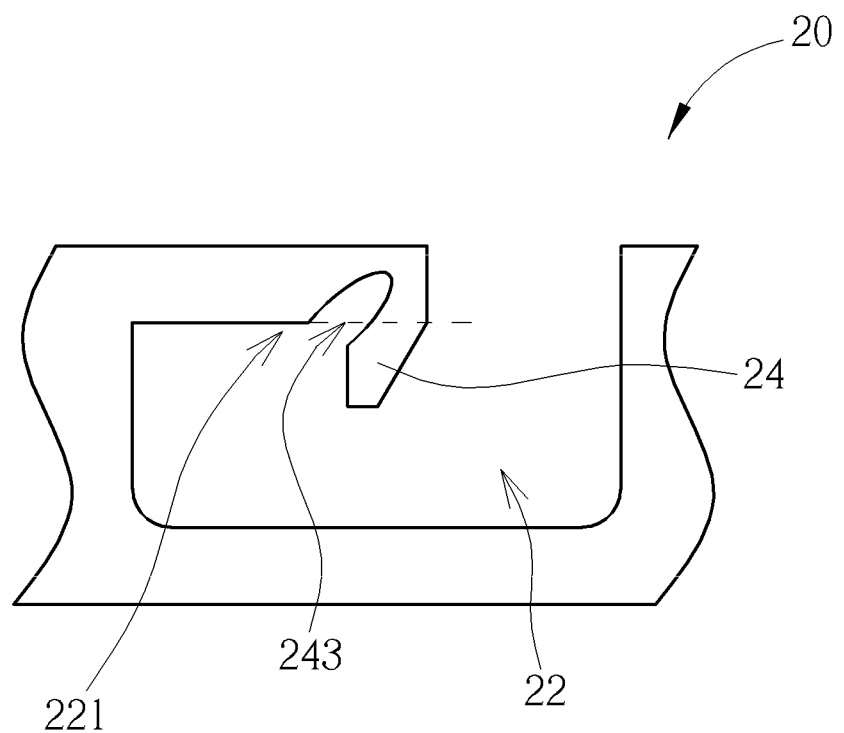

As shown in FIG. 8 and FIG. 9, a sunken structure 243 can be selectively formed on a surface of the engaging portion 24, and a shape of the arc structure 321 can correspond to a curvature of the sunken structure 243. Therefore, the arc structure 321 can slide relative to the engaging portion 24 for inserting into the sunken structure 243 when the contacting portion 32 contacts the engaging portion 24 and the contacting portion 32 is deformed by external force, so as to constrain the movement of the contacting portion 32 relative to the engaging portion 24, and to keep the constraint function of the constraint mechanism 16. The sunken structure 243 can be a hollow slot (as shown in FIG. 8) or a skewed slot (as shown in FIG. 9). Structure of the engaging portion 24 is not limited to the above-mentioned embodiment, and depends on design demand.

Figure 10:
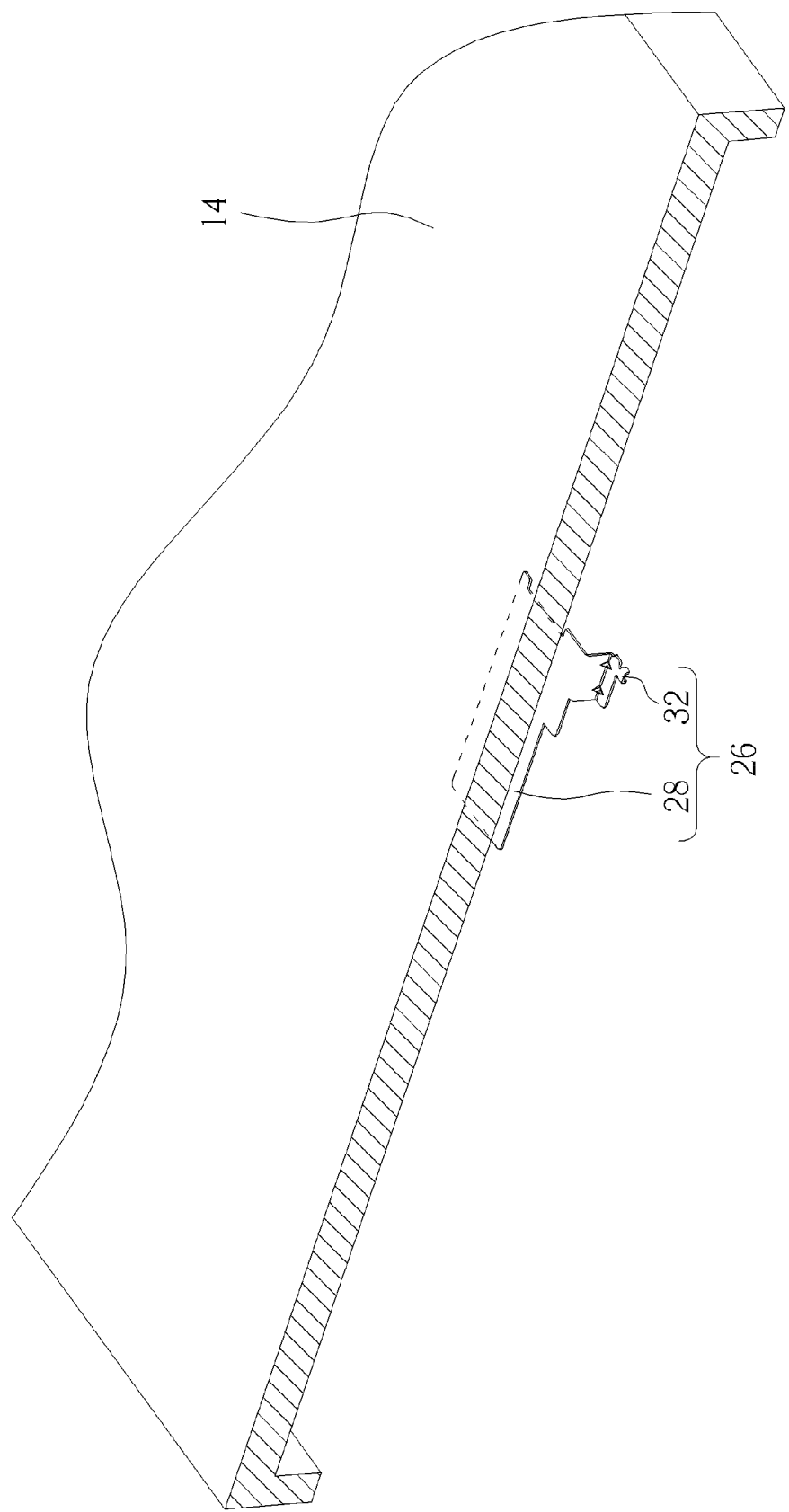
FIG. 10 and FIG. 11 respectively are diagrams of a flexible component according to different embodiments of the present invention.
Figure 11:
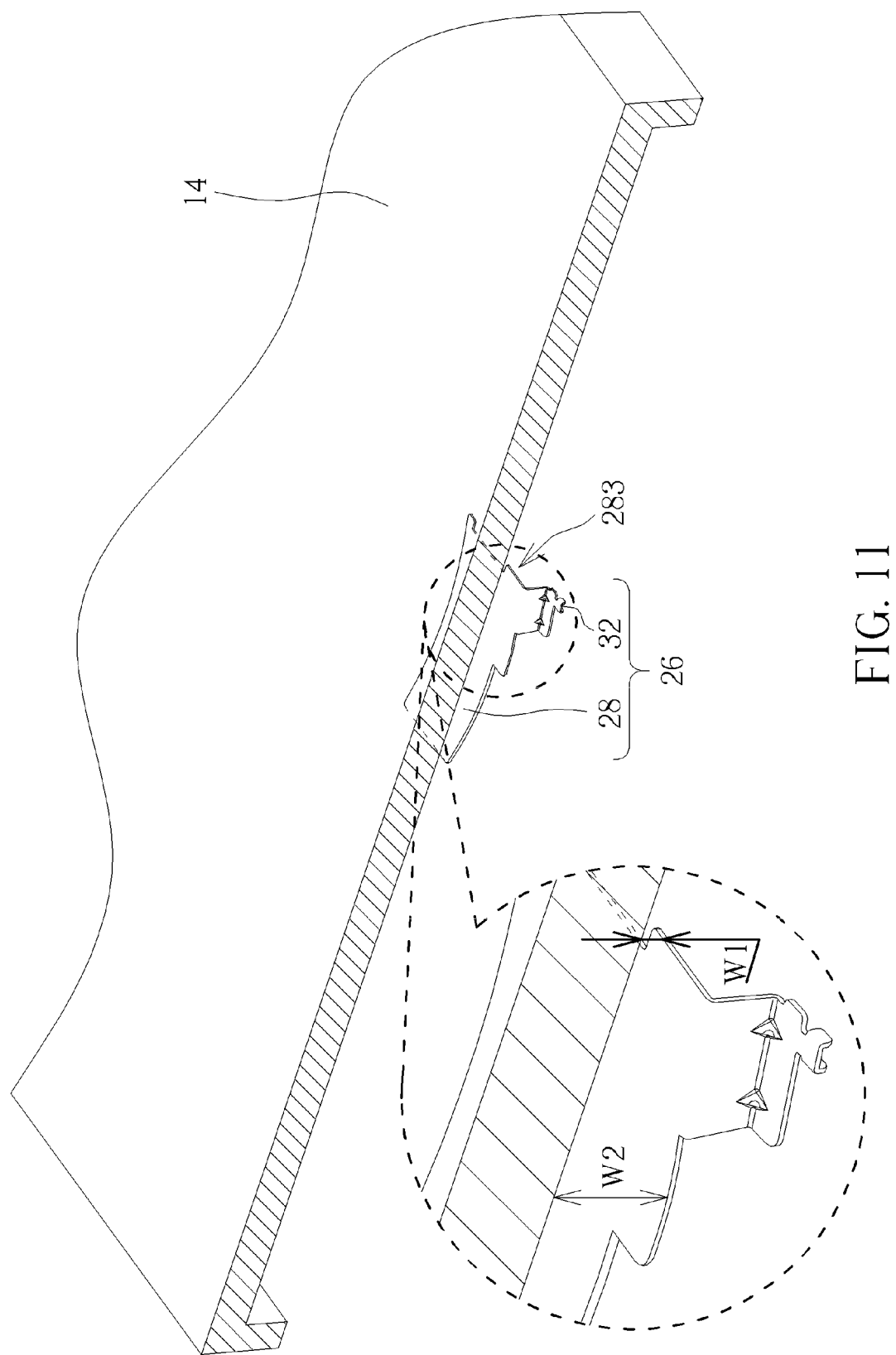

Please refer to FIG. 10 and FIG. 11. FIG. 10 and FIG. 11 respectively are diagrams of the flexible component 26 according to different embodiments of the present invention. As shown in FIG. 10, the flexible component 26 can contact close to the first housing 14, which means the main body 28 is level with the first housing 14, and there is no gap formed between the flexible component 26 and the first housing 14. The contacting portion 32 is not bent upwardly when contacting against the engaging portion 24, so the constraint mechanism 16 can provide stable constraint. As shown in FIG. 11, the main body 28 of the flexible component 26 can be a curved structure. The main body 28 is bent to be an arc, and the second edge 283 of the main body 28 can point toward the first housing 14.

For example, two edges (the first edge 281 and the second edge 283) of the main body 28 can contact the first housing 14, the central area of the main body 28 is spaced from the first housing 14, so the main body 28 can be an arched structure. A gap W1 between the second edge 283 and the first housing 14 is smaller than a gap W2 between the central area and the first housing 14. The curved structure of the flexible component 26 not only provides stress on the first housing 14, but also increases constraint force that prevents the contacting portion 32 from departing from the constraint range of the engaging portion 24.

In conclusion, the present invention utilizes the constraint mechanism 16 to constrain the movement of the first housing 14 relative to the second housing 12. A combination of the block pillar 143 and the block slot 123 of the present invention can constrain the relative movement between the second housing 12 and the first housing 14. Further, the constraint mechanism 16 of the present invention can utilize the engaging portion 24 to block the contacting portion 32 to constrain the relative movement between the second housing 12 and the first housing 14. The first housing 14 may accidently slide relative to the second housing 12 by the external force or the weight itself. When the contacting portion 32 presses the engaging portion 24, the arc structure 321 of the contacting portion 32 can guide the deformed contacting portion 32 to move into an inner of the engaging portion 24, so as to prevent the contacting portion 32 from departing from the constraint range of the engaging portion 24 due to the deformation, and the flexible component 26 can be stably blocked by the constraint component 20.

Figure 12:
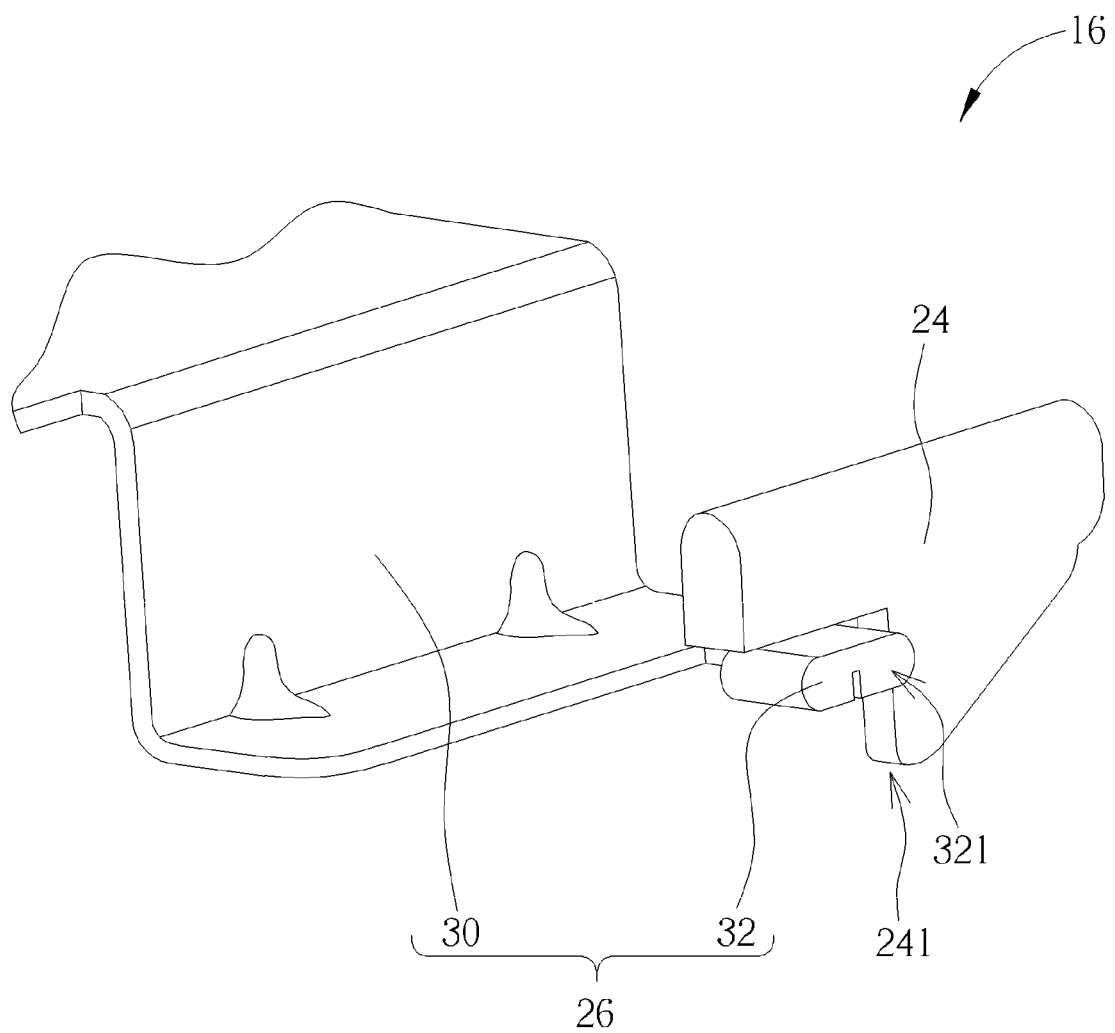
FIG. 12 to FIG. 14 respectively are diagrams of the constraint mechanism in different deformed steps according to the embodiment of the present invention.
Figure 13:
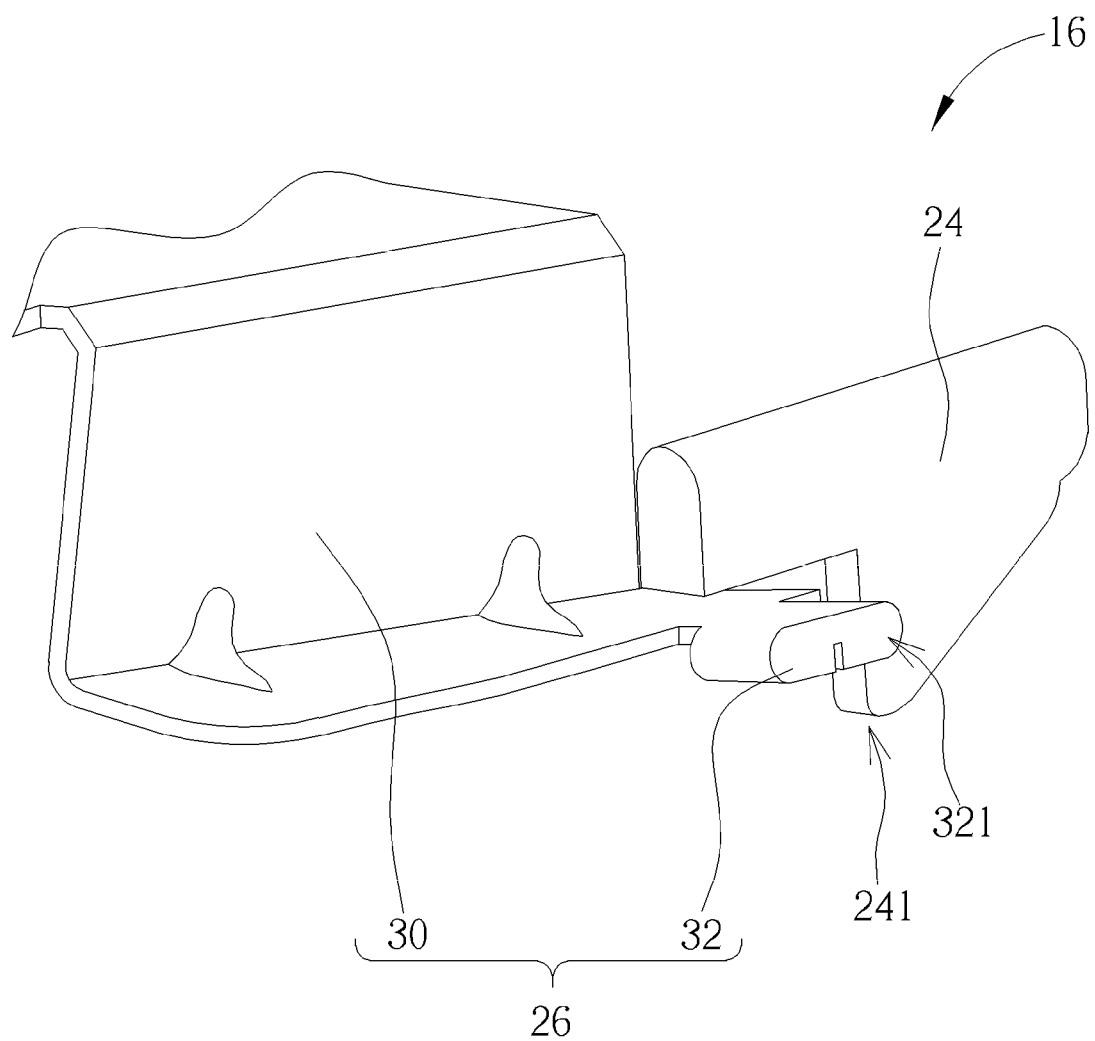
Figure 14:
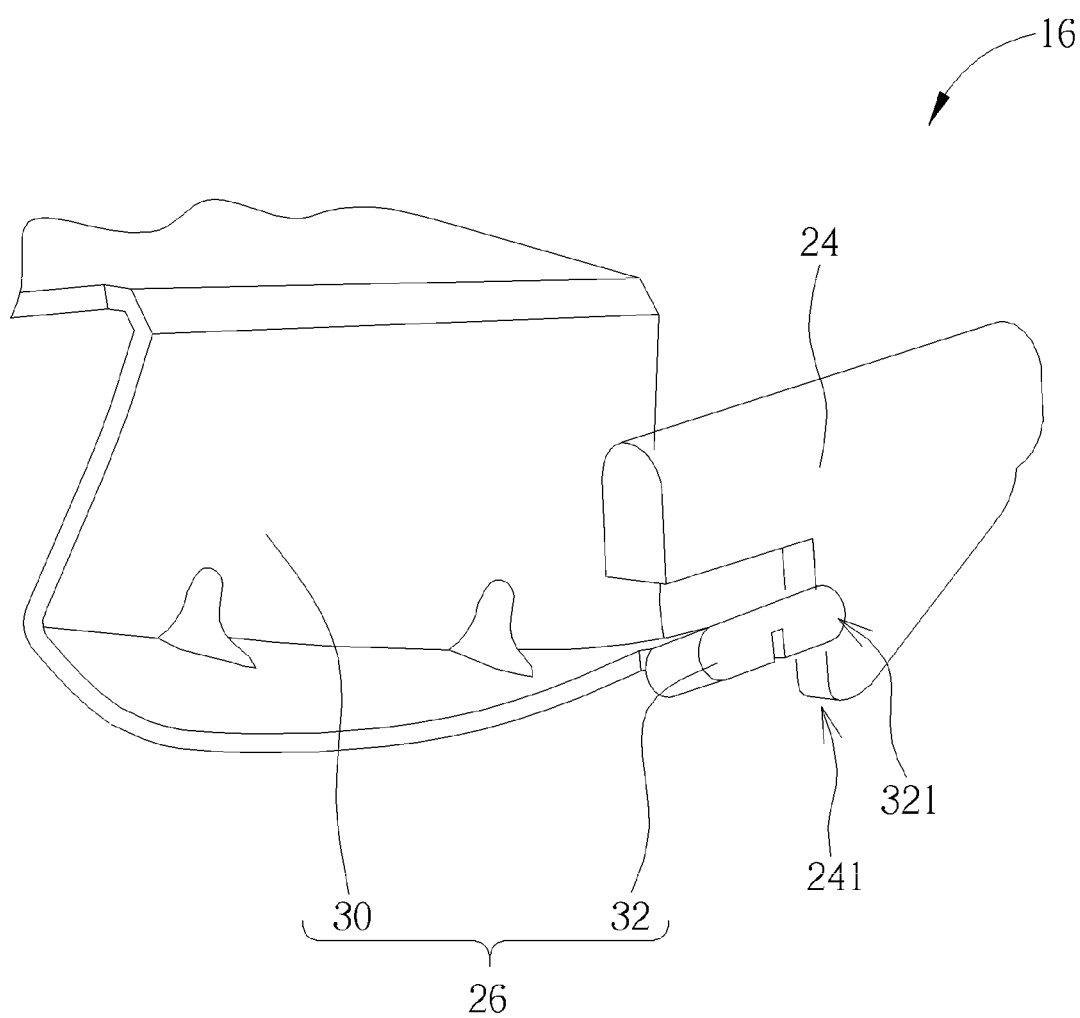

Please refer to FIG. 12 to FIG. 14. FIG. 12 to FIG. 14 respectively are diagrams of the constraint mechanism 16 in different deformed steps according to the embodiment of the present invention. As shown in FIG. 12, the contacting portion 32 just contacts the engaging portion 24. The external force applied to the contacting portion is not huge enough to deform the flexible component 26. As shown in FIG. 13, the external force is increased, and the arc structure 321 can slide the contacting portion 32 relative to the engaging portion 24 upwardly. Meanwhile, the bending portion 30 has local deformation. As shown in FIG. 14, the external force applied to the flexible component 26 is increased further, the bending portion 30 is deformed violently, and the bottom of the bending portion 30 is lower than the top 241 (the lowest position) of the engaging portion 24 due to the over-bending. However, the contacting portion 32 keeps bending upwardly by the arc structure 321 of the present invention, so that the contacting portion 32 can still be blocked by the engaging portion 24 to constrain the movement of the first housing 14 relative to the second housing 12.

Comparing to the prior art, the present invention can lock and unlock the constraint mechanism without tools. The constraint mechanism of the present invention forms the arc structure on the boundary of the contacting portion. The arc structure can be the metal unit including folded edges, and the folded edges are hemmed to 180 degrees. When the contacting portion presses the engaging portion excessively, the contacting portion is deformed, and the deformed contacting portion can slide toward the inner of the engaging portion by the arc structure, so as to prevent the contacting portion from departing from the constraint range of the engaging portion, and to increase the constraint effect of the constraint mechanism. The constraint mechanism of the present invention has advantages of easy structure, simple operation and low manufacturing cost. The present invention can effectively keep the constraint function, so that the constraint mechanism can be widespread applied to the server, the desktop host and so on.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A constraint mechanism of constraining a movement of a first housing relative to a second housing at a first direction and a second direction opposite to each other, the constraint mechanism comprising:
    a constraint component disposed on the second housing, the constraint component comprising a guide slot and an engaging portion, the engaging portion being disposed on an inner lateral surface of the guide slot, and a sunken structure being formed on a surface of the engaging portion; and
    a flexible component disposed on the first housing, the flexible component comprising:
        a main body for covering an opening on the first housing, a first edge of the main body being fixed on the first housing;
        a bending portion, a first side of the bending portion being connected to the main body, a distance between the bending portion and the first edge of the main body being greater than a distance between the bending portion and a second edge of the main body opposite to the first edge; and
        a contacting portion disposed on a second side of the bending portion, the contacting portion comprising a top surface, a bottom surface and two arc surfaces, the two arc surfaces being connected between the top surface and the bottom surface and respectively protruding toward the first direction and the second direction, the top surface slidably contacting a top of the engaging portion and one of the arc surfaces slidably contacting an inner wall of the engaging portion and the bottom surface being not pressed since the contacting portion moves across the engaging portion, the contacting portion being blocked by the engaging portion to constrain the movement of the first housing relative to the second housing when the contacting portion moves along the guide slot to a predetermined position, wherein a boundary of the contacting portion is an arc structure with the arc surfaces, and the arc structure is accommodated inside the sunken structure when the arc structure contacts against the engaging portion.

2. The constraint mechanism of claim 1, wherein deformation of the flexible component is greater than a thickness of the engaging portion.

3. The constraint mechanism of claim 1, wherein the arc structure is a semicircular structure or a dual hemming structure.

4. The constraint mechanism of claim 1, wherein the main body of the flexible component is a curved structure, a distance between the second edge and the first housing is smaller than a distance between the first housing and a central area of the main body.

5. The constraint mechanism of claim 1, further comprising:
    a baffle disposed on the first housing, the baffle covering the flexible component, and an interval being formed between the baffle and the flexible component.

6. The constraint mechanism of claim 5, wherein the interval is smaller than a maximum deformation of the main body of the flexible component.

7. The constraint mechanism of claim 1, wherein the first side of the bending portion is connected to the second edge of the main body.

8. An electronic device comprising:
    a first housing, an opening being formed on a surface of the first housing;
    a second housing, the first housing being movably disposed on the second housing, and at least one electronic component being disposed inside the second housing; and
    a constraint mechanism of constraining a movement of the first housing relative to the second housing at a first direction and a second direction opposite to each other, the constraint mechanism comprising:
        a constraint component disposed on the second housing, the constraint component comprising a guide slot and an engaging portion, the engaging portion being disposed on an inner lateral surface of the guide slot, and a sunken structure being formed on a surface of the engaging portion; and
        a flexible component disposed on the first housing, the flexible component comprising:
            a main body for covering the opening on the first housing, a first edge of the main body being fixed on the first housing;
            a bending portion, a first side of the bending portion being connected to the main body, a distance between the bending portion and the first edge of the main body being greater than a distance between the bending portion and a second edge of the main body opposite to the first edge; and
            a contacting portion disposed on a second side of the bending portion, the contacting portion comprising a top surface, a bottom surface and two arc surfaces, the two arc surfaces being connected between the top surface and the bottom surface and respectively protruding toward the first direction and the second direction, the top surface slidably contacting a top of the engaging portion and one of the arc surfaces slidably contacting an inner wall of the engaging portion and the bottom surface being not pressed since the contacting portion moves across the engaging portion, the contacting portion being blocked by the engaging portion to constrain the movement of the first housing relative to the second housing when the contacting portion moves along the guide slot to a predetermined position, wherein a boundary of the contacting portion is an arc structure with the arc surfaces, and the arc structure is accommodated inside the sunken structure when the arc structure contacts against the engaging portion.

9. The electronic device of claim 8, further comprising:
    a press component movably disposed on the first housing, the press component covering the opening and being placed above the flexible component.

10. The electronic device of claim 8, wherein deformation of the flexible component is greater than a thickness of the engaging portion.

11. The electronic device of claim 8, wherein the arc structure is a semicircular structure or a dual hemming structure.

12. The electronic device of claim 8, wherein the main body of the flexible component is a curved structure, a distance between the second edge and the first housing is smaller than a distance between the first housing and a central area of the main body.

13. The electronic device of claim 8, wherein the constraint mechanism further comprises:
    a baffle disposed on the first housing, the baffle covering the flexible component, and an interval being formed between the baffle and the flexible component.

14. The electronic device of claim 13, wherein the interval is smaller than a maximum deformation of the main body of the flexible component.

15. The electronic device of claim 8, in the first side of the bending portion is connected to the second edge of the main body.

\* \* \* \* \*